(12) United States Patent
Kobayakawa et al.

(10) Patent No.: US 11,488,750 B2
(45) Date of Patent: Nov. 1, 2022

(54) SHUNT RESISTOR

(71) Applicant: Suncall Corporation, Kyoto (JP)

(72) Inventors: Hiroya Kobayakawa, Kyoto (JP); Kenji Murakami, Kyoto (JP)

(73) Assignee: Suncall Corporation, Kyoto (JP)

( * ) Notice: Subject to any disclaimer, the term of this patent is extended or adjusted under 35 U.S.C. 154(b) by 112 days.

(21) Appl. No.: 17/084,803

(22) Filed: Oct. 30, 2020

(65) Prior Publication Data

US 2021/0057132 A1 Feb. 25, 2021

Related U.S. Application Data

(62) Division of application No. 15/765,956, filed as application No. PCT/JP2016/080167 on Oct. 12, 2016, now Pat. No. 10,957,472.

(30) Foreign Application Priority Data

Oct. 15, 2015 (JP) .................................. 2015-203670

(51) Int. Cl.
*H01C 17/245* (2006.01)
*G01R 1/20* (2006.01)
(Continued)

(52) U.S. Cl.
CPC ........... *H01C 17/245* (2013.01); *G01R 1/203* (2013.01); *H01C 1/014* (2013.01); *H01C 1/14* (2013.01); *H01C 1/148* (2013.01); *H01C 17/28* (2013.01)

(58) Field of Classification Search
CPC ...... H01C 17/245; H01C 17/28; H01C 1/014; H01C 1/14; H01C 1/148; G01R 1/203
See application file for complete search history.

(56) References Cited

U.S. PATENT DOCUMENTS 5,214,407 A * 5/1993 McKim, Jr. ............ H01C 17/24
338/195
6,242,999 B1 6/2001 Nakayama et al.
(Continued)

FOREIGN PATENT DOCUMENTS

JP 63-118201 7/1988
JP 03-075505 7/1991
(Continued)

OTHER PUBLICATIONS

International Search Report issued in International Application No. PCT/JP2016/080167, dated Jan. 10, 2017.
(Continued)

*Primary Examiner* — Kyung S Lee
(74) *Attorney, Agent, or Firm* — Sterne, Kessler, Goldstein & Fox P.L.L.C.

(57) ABSTRACT

A manufacturing method of shunt resistor according to the present invention includes a step of calculating a difference between an initial resistance value and a desired resistance value as a resistance value to be adjusted, a step of providing a plurality of recess forming members capable of forming recesses each having a characteristic size in the surface of a resistive alloy plate, a recess determining step of determining the size and the number of the recesses necessary to be formed at the surface of the resistive alloy plate, and a recess forming step of forming the recesses according to the size and the number determined in the recess determining step by using the corresponding recess forming members.

20 Claims, 4 Drawing Sheets

(51) Int. Cl.
  *H01C 1/014* (2006.01)
  *H01C 1/14* (2006.01)
  *H01C 1/148* (2006.01)
  *H01C 17/28* (2006.01)

(56) References Cited

U.S. PATENT DOCUMENTS

| | | | |
|---|---|---|---|
| 6,492,896 B2 | 12/2002 | Yoneda | |
| 8,319,598 B2 * | 11/2012 | Zandman | H01C 17/23 338/195 |
| 8,884,733 B2 * | 11/2014 | Hetzler | H01C 7/06 338/195 |
| 9,460,834 B2 * | 10/2016 | Croci | G01L 9/04 |
| 9,911,524 B2 * | 3/2018 | Tanaka | H01C 17/242 |
| 9,934,893 B2 * | 4/2018 | Murakami | H01C 17/22 |
| 11,170,918 B2 * | 11/2021 | Ushiyama | H01C 7/22 |

FOREIGN PATENT DOCUMENTS

| | | |
|---|---|---|
| JP | 10-032110 A | 3/1998 |
| JP | 11162720 A | 6/1999 |
| JP | 2001332409 A | 11/2001 |
| JP | 2003-115401 A | 4/2003 |
| JP | 2007141907 A | 6/2007 |
| JP | 2009117750 A | 5/2009 |
| JP | 2009-266977 A | 11/2009 |
| JP | 2011-114038 | 6/2011 |
| JP | 2011-114038 | 9/2011 |
| JP | 2015-82552 A | 4/2015 |

OTHER PUBLICATIONS

International Preliminary Report on Patentability issued on Application No. PCT/JP2016/080167 dated Apr. 26, 2018, 14 pages.

* cited by examiner

SHUNT RESISTOR

This application is a divisional of U.S. patent application Ser. No. 15/765,956 filed on Apr. 4, 2018.

FIELD OF THE INVENTION

The present invention relates to a method for manufacturing a shunt resistor used for determining a current value.

BACKGROUND ART

The shunt resistor is a component that is utilized when determining a current value of an electric circuit, wherein the determining the current value is achieved by having the shunt resistor connected in serial with the electric circuit, which is the target of detecting the current value, and then measuring a voltage difference between both sides across the shunt resistor. The shunt resistor is widely utilized in various fields such as the field of bus rings (bus bars) in rotary motors.

For example, Patent Literature 1 below proposes a method for manufacturing a shunt resistor having a desired resistance value by joining a thick film resistor to a pair of electrode conductors, which are disposed to face each other on an insulating substrate, so as to connect the pair of electrode conductors, and providing slits in the thick film resistor by laser trimming.

Although the method described in Patent Literature 1 can provide a desired resistance value by adjusting the length, number, and pitch of slits formed by laser trimming, in a plan view as viewed in the direction perpendicular to the plate surface, slits are formed so as to open outward. Accordingly, the strength of the slitted portion, especially the bending strength in the direction perpendicular to the plate surface, is reduced, possibly causing the shunt resistor to be broken or damaged by vibrations and bending stress that may be received in a state during use. In particular, this possibility is increased when the pitch between multiple slits is reduced.

Moreover, with slits being open outward in a plan view, the edge part of the slits is likely to come into contact with external peripheral components, and this also is problematic by making the shunt resistor liable to be broken or damaged.

Furthermore, there is also a problem in that laser trimming generates cutting waste when forming slits, and cutting waste needs to be removed in a subsequent step.

Patent Literature 2 below discloses a method for manufacturing a shunt resistor, wherein a resistance value adjustment hole is formed by being punched out with a first punch and, moreover, a shunt resistor is formed by being punched out with a second punch so as to cross the resistance value adjustment hole.

However, in the shunt resistor manufactured by this method as well, the notch formed by the resistance value adjustment hole is open outward in a plan view. Accordingly, the strength of the notched portion, especially the bending strength in the direction perpendicular to the plate surface, is reduced, possibly causing the shunt resistor to be broken or damaged by vibrations and bending stress that may be received in a state during use.

Moreover, because the notch is open outward in a plan view, the edge part of the notch is likely to come into contact with external peripheral components, and this also is problematic by making the shunt resistor liable to be broken or damaged.

Furthermore, there is also a problem in that the punch generates punched-out debris when forming the resistance value adjustment hole, and debris needs to be removed in a subsequent step.

PRIOR ART DOCUMENT

Patent Literature

Patent Literature 1: JP H10-032110A
Patent Literature 2: JP 2011-114038A

DISCLOSURE OF THE INVENTION

The present invention has been conceived in view of such conventional art, and an object of the present invention is to provide a shunt resistor manufacturing method capable of easily manufacturing a shunt resistor having a desired resistance value without generating unnecessary materials such as cutting waste and punched-out debris and without resulting in local strength reduction.

In order to achieve the object, the present invention provides a manufacturing method of shunt resistor that includes a pair of electrode plates spaced apart from each other in a plate surface direction and a resistive alloy plate that connects the pair of electrode plates and that is configured so that a resistance value between the pair of electrode plates is adjusted to a desired resistance value, the manufacturing method including a step of providing an alloy member for forming the resistive alloy plate, the alloy member having such a resistance value that the resistance value between the pair of electrode plates in a state where the alloy member connects the pair of electrode plates is smaller than the desired resistance value; a step of forming a resistor preassembly by connecting the pair of electrode plates via the alloy member; a step of measuring the resistance value between the pair of electrode plates in the resistor preassembly as an initial resistance value; a step of calculating a difference between the initial resistance value and the desired resistance value as a resistance value to be adjusted; a step of providing a plurality of recess forming members capable of forming recesses each having a characteristic size in the surface of the resistive alloy plate by being pressed against the surface of the resistive alloy plate; a recess determining step of determining the size and the number of the recesses necessary to be formed so that the resistance value of the resistive alloy plate that increases in accordance with the sizes of the recess capable of being formed by the respective plurality of recess forming members is the resistance value to be adjusted; and a recess forming step of forming the recesses according to the size and the number determined in the recess determining step by using the corresponding recess forming members among the plurality of recess forming members.

Since the manufacturing method of shunt resistor according to the present invention is configured to calculate the difference between the initial resistance value and the desired resistance value as the resistance value to be adjusted, provide a plurality of recess forming members capable of forming recesses each having a characteristic size in the surface of the resistive alloy plate, determine the size and the number of the recesses necessary to be formed at the surface of the resistive alloy plate so that the resistance value of the resistive alloy plate that increases in accordance with the sizes of the recess capable of being formed by the respective plurality of recess forming members is the resistance value to be adjusted, and form the recesses according to the size and the number determined in the recess determining step by using the corresponding recess forming members, the manufacturing method makes it possible to easily manufacture the shunt resistor having the desired resistance value without generating unnecessary materials such as cutting waste and punched-out debris during the manufacturing process and also without resulting in local strength reduction in a finished form.

Preferably tips of the plurality of recess forming members that are pressed against the surface of the resistive alloy plate may have a shape of a quadrangular pyramid or a cone.

In one embodiment, the plurality of recess forming members includes a first recess forming member capable of forming a first recess having a first size, a second forming member capable of forming a second recess smaller than the first recess and a third recess forming member capable of forming a third recess smaller than the second recess.

In this embodiment, the recess determining step includes a first calculating step of calculating the number of the first recesses that can be formed within the range of the resistance value to be adjusted, a second calculating step of calculating the number of the second recesses that can be formed within the range of the remaining resistance value to be adjusted obtained by subtracting the resistance value increased according to the number of the first recesses calculated in the first calculating step, and a third calculating step of calculating the number of the third recesses that can be formed within the range of the remaining resistance value to be adjusted obtained by subtracting the resistance value increased according to the number of the second recesses calculated in the second calculating step.

In an example of the aforementioned one embodiment, the first recess has such a size that the resistance value between the pair of electrode plates can be increased by a first resistance value, the second recess has such a size that the resistance value between the pair of electrode plates can be increased by a second resistance value that is half the first resistance value, and the third recess has such a size that the resistance value between the pair of electrode plates can be increased by a third resistance value that is half the second resistance value.

In the aforementioned one embodiment, the surface of the resistive alloy plate preferably has first to third regions where the first to third recesses are respectively formed.

EMBODIMENT FOR CARRYING OUT THE INVENTION

Below, one embodiment of the method for manufacturing a shunt resistor according to the present invention will now be described with reference to the appended drawings.

Figure 1:
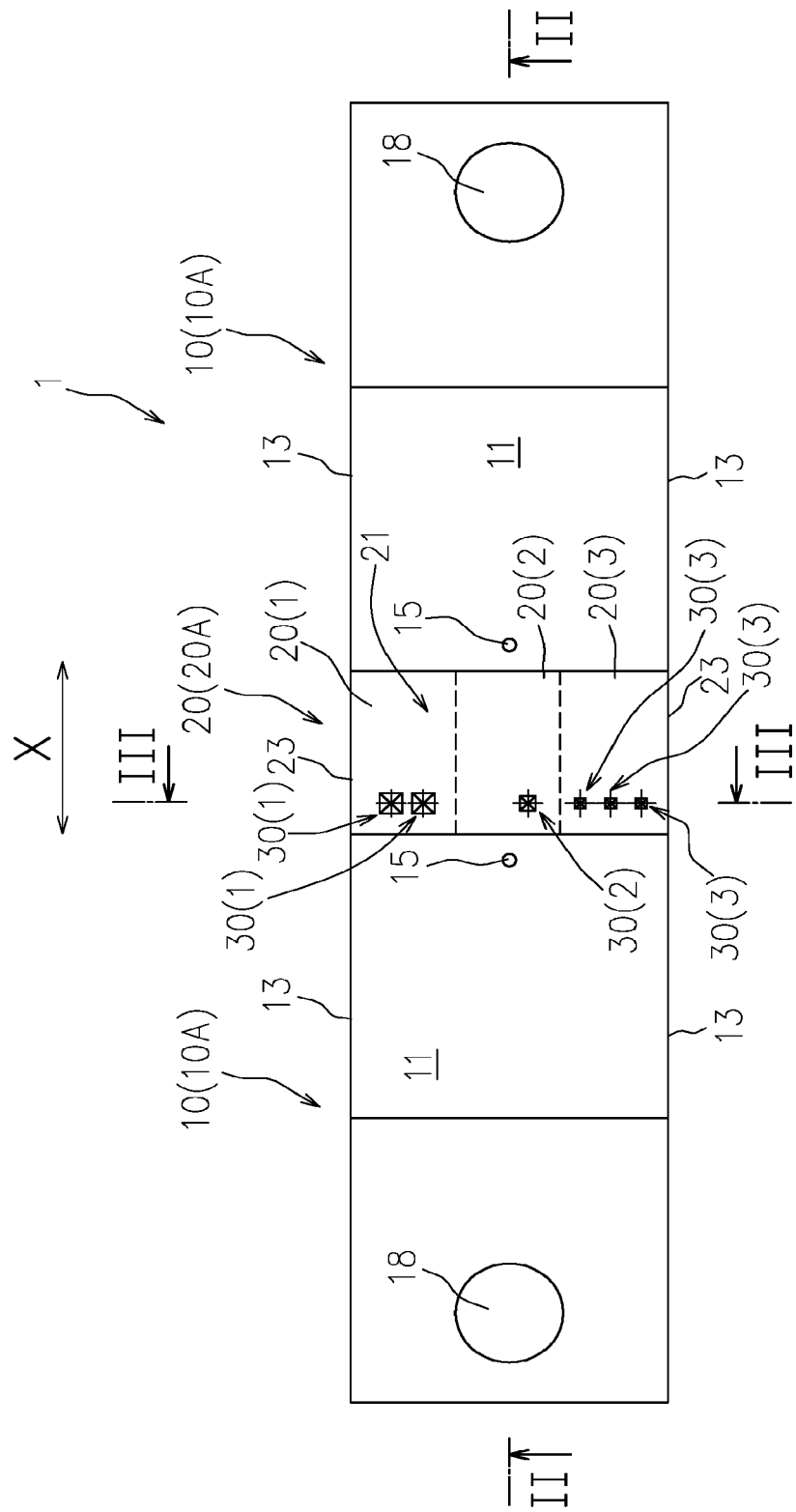
FIG. 1 shows a plan view of a shunt resistor manufactured by a manufacturing method according to one embodiment of the present invention.

FIG. 1 shows a plan view of a shunt resistor 1 manufactured by the manufacturing method according to this embodiment.

Figure 2:
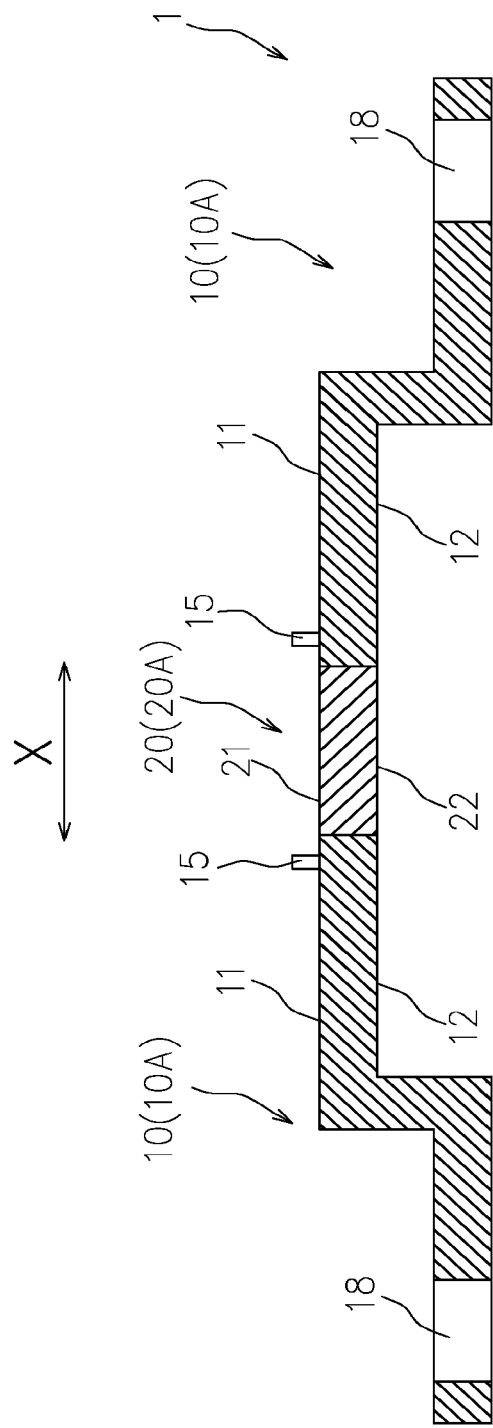
FIG. 2 is a cross-sectional view of the shunt resistor taken along the line II-II in FIG. 1.

Also, FIG. 2 shows a cross-sectional view of the shunt resistor 1 taken along the line II-II in FIG. 1.

Figure 3:
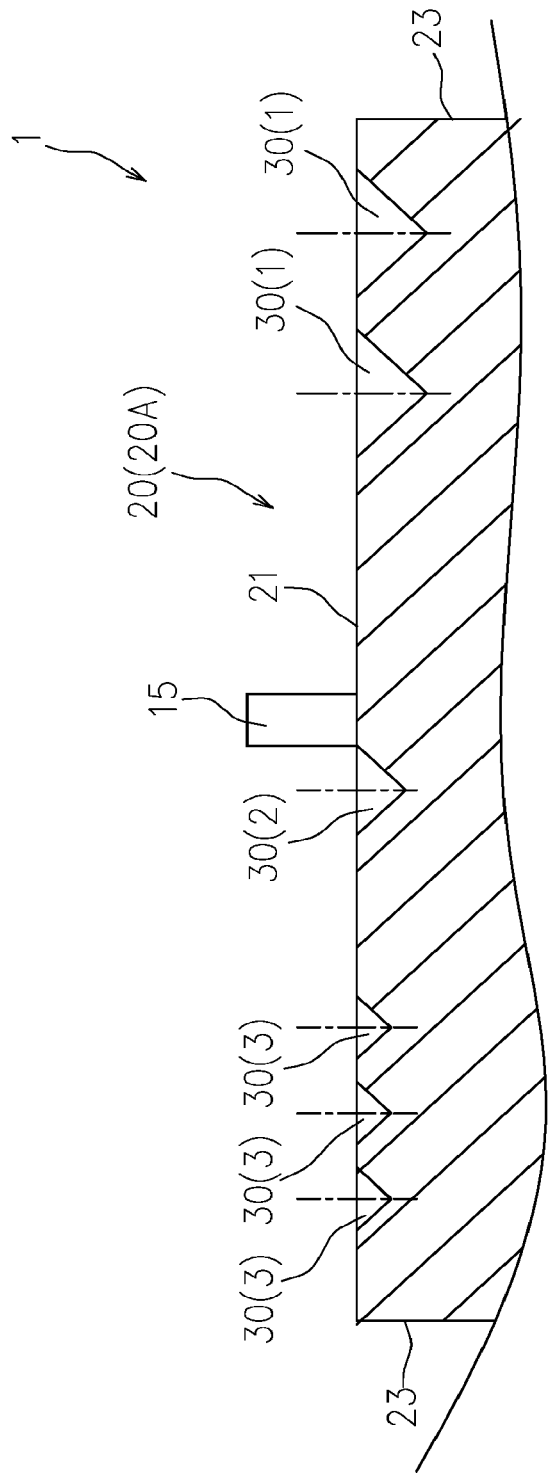
FIG. 3 is a partially enlarged cross-sectional view of the shunt resistor taken along the line in FIG. 1.

Moreover, FIG. 3 shows a partially enlarged cross-sectional view of the shunt resistor taken along the line in FIG. 1.

As shown in FIGS. 1 and 2, the shunt resistor 1 includes a pair of electrode plates 10, 10 spaced apart from each other in the plate surface direction, and a resistive alloy plate 20 connecting the pair of electrode plates 10, 10.

The electrode plates 10 are formed of an electroconductive member 10A, and, for example, a metal plate of Cu is suitably utilized.

As shown in FIGS. 1 and 2, the pair of electrode plates 10, 10 respectively have a pair of detection terminals 15, 15 positioned adjacent to the resistive alloy plate 20 that connects the electrode plates 10, 10.

Reference number 18 in FIGS. 1 and 2 indicates a fastening through-hole used to secure the shunt resistor 1 to a predetermined position.

The resistive alloy plate 20 is a component that mechanically and electrically connects the pair of electrode plates 10, 10 and in which resistance value adjustment work is performed so as to provide a desired resistance value between the pair of electrode plates 10, 10.

For example, a Cu—Mn alloy, a Ni—Cr alloy, or a Cu—Ni alloy is suitably utilized as the resistive alloy plate 20.

As shown in FIGS. 1 and 3, in the shunt resistor 1, the resistance value between the pair of electrode plates 10, 10 is adjusted to be a desired resistance value by one or a plurality of recesses 30 formed in the surface of the resistive alloy plate 20.

That is to say, multiple types of recesses 30(1), 30(2), 30(3), and so on that have different sizes and are each provided in a necessary number are formed in the surface of the resistive alloy plate 20.

Specifically, the recesses 30 reduce the cross-sectional area of the resistive alloy plate 20 across the cross section in the direction perpendicular to a direction of electrical conduction X according to their respective sizes, and thus increase the resistance value of the resistive alloy plate 20 according to this reduction of cross-sectional area.

Accordingly, by forming the multiple types of recesses 30(1), 30(2), 30(3), and so on each in a necessary number, it is possible to increase the resistance value between the pair of electrode plates 10, 10 from the initial resistance value (the resistance value between the pair of electrode plates 10, 10 in a state prior to forming the recesses 30 in the surface of the resistive alloy plate 20) to the desired resistance value.

Preferably, as shown in FIGS. 1 and 3, the plurality of recesses 30(1), 30(2), 30(3), and so on are disposed along the same cross section in the direction perpendicular to the direction of electrical conduction X.

According to this configuration, the area of the electrically conducting region of the resistive alloy plate 20 can be accurately reduced by the plurality of recesses 30, and adjustment of the resistance value by the plurality of recesses 30 can be reliably performed.

In the illustrated embodiment, the recesses 30 include a first recess 30(1) having a first size, a second recess 30(2) smaller than the first recess 30(1), and a third recess 30(3) smaller than the second recess 30(2), and are formed such that two first recesses 30(1), one second recess 30(2), and three third recesses 30(3) are positioned along the same cross section.

The first recess 30(1) has such a size that the resistance value between the pair of electrode plates 10, 10 can be increased by a first resistance value, the second recess 30(2), for example, has such a size that the resistance value between the pair of electrode plates 10, 10 can be increased by a second resistance value that is half the first resistance value, and the third recess 30(3), for example, has such a size that the resistance value between the pair of electrode plates 10, 10 can be increased by a third resistance value that is half the second resistance value.

Below, the method for manufacturing the shunt resistor 1 according to the present embodiment will now be described.

The manufacturing method has a step of providing a pair of conductive members 10A, 10A for forming the pair of electrode plates 10, 10 and an alloy member 20A for forming the resistive alloy plate 20, and a step of forming a resistor preassembly by connecting the pair of conductive members 10A, 10A via the alloy member 20A.

Here, in a state where the pair of conductive members 10A, 10A (the pair of electrode plates 10, 10) are connected via the alloy member 20A, the alloy member 20A has such a resistance value that the resistance value (the initial resistance) between the pair of conductive members 10A, 10A (the pair of electrode plates 10, 10) is smaller than a desired resistance value that is desired in a finished state of the shunt resistor 1.

Figure 4:
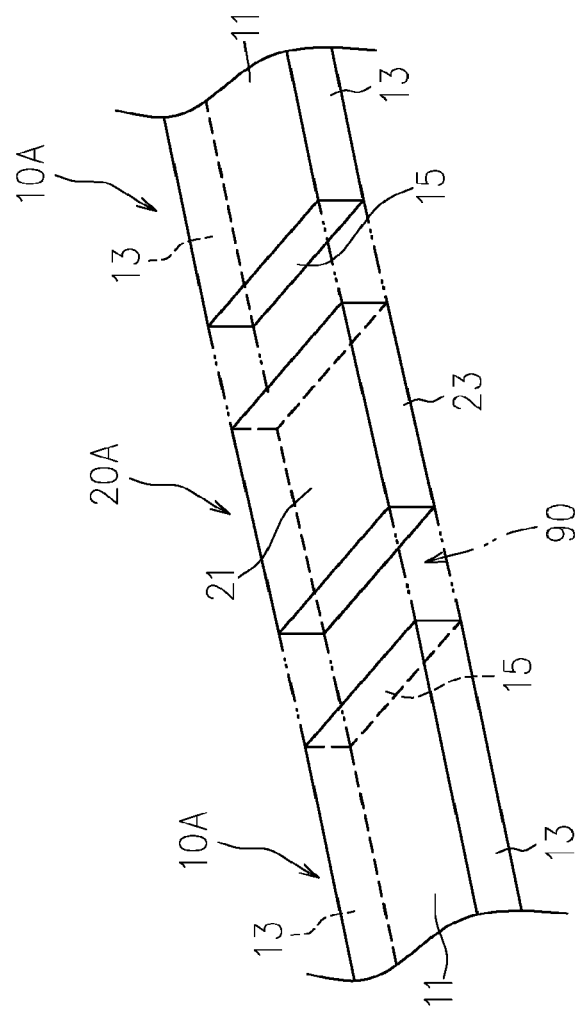
FIG. 4 is a schematic perspective view showing a step of the manufacturing method according to the one embodiment of the present invention.

In order to enable the resistance value of the alloy member 20A (the resistive alloy plate 20) to be accurately adjusted by the recesses 35 formed in the recess forming step described below, it is preferable that as shown in FIG. 4 the alloy member 20A is formed such that the alloy member 20A in a state of connecting the pair of electrode plates 10, 10 is entirely disposed in a space between opposing end faces 15, 15 of the pair of electrode plates 10, 10.

That is to say, as shown in FIGS. 2 and 4, the alloy member 20A can be formed such that, in a state where the pair of electrode plates 10, 10 are connected via the alloy member 20A, an upper surface 21 of the alloy member 20A is positioned so as to be flush with upper surfaces 11, 11 of the pair of electrode plates 10, 10 or below the upper surfaces 11, 11, a bottom surface 22 of the alloy member 20A is positioned so as to be flush with bottom surfaces 12, 12 of the pair of electrode plates 10, 10 or above the bottom surfaces 12, 12, and a side surface 23 of the alloy member 20A is positioned so as to be flush with the corresponding side surfaces 13, 13 of the pair of electrode plates 10, 10 or more inward than the side surfaces 13, 13.

The manufacturing method next has a step of measuring the resistance value between the pair of conductive members 10A, 10A (the pair of electrode plates 10, 10) in the resistor preassembly as an initial resistance value, and a step of calculating the difference between the initial resistance value and a desired resistance value as a resistance value to be adjusted.

The manufacturing method is configured to increase the resistance value from the initial resistance value to the extent corresponding to the resistance value to be adjusted, by forming the recesses 30 in the surface of the alloy member 20A (the resistive alloy plate 20).

Specifically, the manufacturing method has a step of providing a plurality of recess forming members (not shown) that form the recesses 30 each having a characteristic size in the surface of the alloy member 20A (the resistive alloy plate 20) by being pressed against the surface of the alloy member 20A (the resistive alloy plate 20).

The plurality of recess forming members may be, for example, pins, the tips of which to be pressed against the surface of the alloy member 20A (the resistive alloy plate 20) have a shape of a quadrangular pyramid or a cone.

Next, the manufacturing method has a recess determining step of determining the size and the number of the recesses 30 necessary to be formed to increase the resistance value of the alloy member 20A (the resistive alloy plate 20) to the extent of the resistance value to be adjusted.

That is to say, resistance value increase information concerning how much the resistance value of the alloy member 20A (the resistive alloy plate 20) is increased by recesses that can be formed respectively by the plurality of recess forming members can be obtained in advance through experimentation or the like.

The recess determining step determines the combination of the size and the number of the recesses 30 necessary for increasing the resistance value of the alloy member 20A (the resistive alloy plate 20) to the extent of the resistance value to be adjusted, based on the resistance value increase information.

As in the illustrated embodiment, in a case where the recesses 30 include the first recess 30(1) having a first size, the second recess 30(2) smaller than the first recess 30(1), and the third recess 30(3) smaller than the second recess 30(2), the recess determining step can be configured to include a first calculating step of calculating the number of the first recesses 30(1) that can be formed within the range of the resistance value to be adjusted, a second calculating step of calculating the number of the second recesses 30(2) that can be formed within the range of the remaining resistance value to be adjusted obtained by subtracting the resistance value increased according to the number of the first recesses 30(1) calculated in the first calculating step, and a third calculating step of calculating the number of the third recesses 30(3) that can be formed within the range of the remaining resistance value to be adjusted obtained by subtracting the resistance value increased according to the number of the second recesses 30(2) calculated in the second calculating step.

According to this configuration, it is possible to adjust the resistance value of the shunt resistor 1 to be a desired resistance value while reducing the total number of the recesses 30 formed in the surface of the resistive alloy plate 20 as much as possible The manufacturing method further has a recess forming step of forming the recesses 30 according to the size and the number determined in the recess determining step by using the corresponding recess forming members among the plurality of recess forming members.

Preferably, in the recess forming step, the recesses 35 are formed such that all recesses 35 to be formed are located along the same cross section in the direction perpendicular to the direction of electrical conduction X.

According to the manufacturing method thus configured, the shunt resistor 1 having a desired resistance value can be easily manufactured without generating unnecessary materials such as cutting waste and punched-out debris during the manufacturing process and without resulting in local strength reduction in a finished form.

That is to say, in a conventional configuration for manufacturing a shunt resistor having a desired resistance value by forming slits that are open outward in a plan view in the direction perpendicular to the plate surface while adjusting the pitch, number and/or length of the slits by laser trimming, the strength of the slitted portion, especially the bending strength in the direction perpendicular to the plate surface, is reduced, possibly causing the shunt resistor to be broken or damaged by vibrations and bending stress that may be received in a state during use.

Moreover, because the slits are open outward in a plan view, the edge part of the slits is likely to come into contact with external peripheral components, and this also is problematic by making the shunt resistor liable to be broken or damaged.

Furthermore, there is also a problem in that laser trimming generates cutting waste when forming slits, and cutting waste need to be removed in a subsequent step.

Also, in another conventional configuration for manufacturing a shunt resistor having a desired resistance value wherein a resistance value adjustment hole is formed by being punched out with a first punch and, moreover, a shunt resistor is formed by being punched out with a second punch so as to cross the resistance value adjustment hole, the notch formed by the resistance value adjustment hole is open outward in a plan view, and therefore the strength of the notched portion, especially the bending strength in the direction perpendicular to the plate surface, is reduced, possibly causing the shunt resistor to be broken or damaged by vibrations and bending stress that may be received in a state during use.

Moreover, the edge part of the notch is likely to come into contact with external peripheral components, and this also is problematic by making the shunt resistor liable to be broken or damaged.

Furthermore, there is also a problem in that the punch generates punched-out debris when forming resistance value adjustment holes and is problematic in that debris needs to be removed in a subsequent step.

The manufacturing method according to this embodiment enables a shunt resistor having a desired resistance value to be easily manufactured while preventing such disadvantages of conventional art.

In the shunt resistor 1 manufactured by the manufacturing method according to this embodiment, the adjusted resistance value can be reliably recognized by checking the size and the number of the recesses 30 formed in the surface of the resistive alloy plate 20.

Accordingly, when the initial resistance value is already known, the resistance value of the shunt resistor 1 can be reliably recognized by checking the size and the number of the recesses 30.

In this case, dividing the surface of the resistive alloy plate 20 into a plurality of regions where recesses with a plurality of sizes are to be respectively formed and forming the corresponding recesses in the corresponding regions make it easy to visually recognize the size and the number of the recesses 30.

As described above, in this embodiment, the recesses 30 have three different sizes, i.e., the first to third recesses 30(1) to 30(3).

Accordingly, as shown in FIG. 1, the surface of the resistive alloy plate 20 is divided into first to third regions 20(1) to 20(3) where the first to third recesses 30(1) to 30(3) are respectively formed.

DESCRIPTION OF THE REFERENCE NUMERALS

1 Shunt resistor
10 Electrode plate
20 Resistive alloy plate
20A Alloy member
20(1) First region
20(2) Second region
20(3) Third region
30 Recess
30(1) First recess
30(2) Second recess
30(3) Third recess

What is claimed is:

1. A shunt resistor, comprising:
   a pair of electrode plates spaced apart from each other in a plate surface direction; and
   a resistive alloy plate that connects the pair of electrode plates, the shunt resistor having a desired resistance value between the pair of electrode plates;
   wherein the resistive alloy plate is formed by an alloy member having a resistance value between the pair of electrode plates when the alloy member connects the pair of electrode plates that is smaller than the desired resistance value,
   wherein a surface of the resistive alloy plate is provided with multiple types of recesses, each type having different sizes, wherein a first type of the recesses has a size that is larger than a size of a second type of the recesses, wherein the recesses are configured to cause the resistance value between the pair of electrode plates to be the desired resistance value, wherein a number of the first type of recesses that are provided on the surface is a maximum number of the first type of recesses required to cause the desired resistance value, and
   wherein the multiple types of recesses are located along the same cross section in a direction perpendicular to a direction of electrical conduction.

2. The shunt resistor of claim 1,
   wherein the resistive alloy plate has at the surface a plurality of regions divided for each of the multiple types of the recesses, and
   wherein the same types of recesses are formed in a corresponding region.

3. The shunt resistor of claim 1, wherein there are at least three types of recesses provided on the surface of the resistive alloy plate.

4. The shunt resistor of claim 3, wherein each of the three types of recesses has a size that is different from sizes of the other two types of recesses.

5. The shunt resistor of claim 1, wherein the shape of each of the recesses is selected from the group consisting of a quadrilateral pyramid or a cone.

6. The shunt resistor of claim 1, wherein all of the recesses are disposed along the same cross section in the direction perpendicular to a direction of electrical conduction.

7. The shunt resistor of claim 1, wherein the surface of the of the resistive alloy plate is flush with upper surfaces of each of the pair of electrode plates, and wherein a bottom surface of the resistive alloy plate is flush with bottom surfaces of each of the pair of electrode plates.

8. A shunt resistor, comprising:
   a pair of electrode plates spaced apart from each other in a plate surface direction; and
   a resistive alloy plate that connects the pair of electrode plates, the shunt resistor having a desired resistance value between the pair of electrode plates, the resistive alloy plate formed by an alloy member having a resistance value between the pair of electrode plates when the alloy member connects the pair of electrode plates that is smaller than the desired resistance value;
   a first recess having a size disposed on an upper surface of the resistive alloy plate;
   a second recess having a size different from the size of the first recess disposed on an upper surface of the resistive alloy plate; and a third recess having a size different from the size of the first recess and the size of this second recess disposed on an upper surface of the resistive alloy plate,
wherein the first recess, second recess, and third recess are configured to increase the resistance value between the pair of electrode plates to be the desired resistance value.

9. The shunt resistor of claim 8, wherein the first recess, second recess, and third recess are located along the same cross section in a direction perpendicular to a direction of electrical conduction.

10. The shunt resistor of claim 8,
wherein the first recess, second recess, and third recess are each formed in a corresponding first region, second region, and third region on the top surface of the resistive alloy plate, and
wherein the first region, second region, are arranged along the same cross section taken perpendicular to the direction of electrical conduction.

11. The shunt resistor of claim 8, wherein the shape of each of the first recess, second recess, and third recess is selected from the group consisting of a quadrilateral pyramid or a cone.

12. The shunt resistor of claim 8, wherein any recesses formed on the top surface are disposed along the same cross section in the direction perpendicular to a direction of electrical conduction.

13. The shunt resistor of claim 8, wherein the top surface of the of the resistive alloy plate is flush with upper surfaces of each of the pair of electrode plates, and wherein a bottom surface of the resistive alloy plate is flush with bottom surfaces of each of the pair of electrode plates.

14. The shunt resistor of claim 8, wherein the size of the first recess is larger than the size of the second recess, and wherein the size of the second recess is larger than the size of the third recess, and
wherein a number of the first recesses that are provided on the top surface is a maximum number of the first recesses required to cause the desired resistance value.

15. A shunt resistor, comprising:
a pair of electrode plates spaced apart from each other in a plate surface direction; and
a resistive alloy plate that connects the pair of electrode plates, the shunt resistor having a desired resistance value between the pair of electrode plates;
wherein the resistive alloy plate is formed by an alloy member having a resistance value between the pair of electrode plates when the alloy member connects the pair of electrode plates that is smaller than the desired resistance value,
wherein a surface of the resistive alloy plate is provided with multiple types of recesses, each type having different sizes, wherein the recesses are configured to cause the resistance value between the pair of electrode plates to be the desired resistance value,
wherein the shape of each of the types of recesses is selected from the group consisting of: a quadrilateral pyramid and a cone, and
wherein the multiple types of recesses are located along the same cross section in a direction perpendicular to a direction of electrical conduction.

16. The shunt resistor of according to claim 15,
wherein the resistive resistance alloy plate has at the surface a plurality of regions divided for each of the multiple types of the recesses, and
wherein the same types of recesses are formed in a corresponding region.

17. The shunt resistor of claim 15, wherein there are at least three types of recesses provided on the surface of the resistive alloy plate.

18. The shunt resistor of claim 17, wherein each of the three types of recesses has a size that is different from sizes of the other two types of recesses.

19. The shunt resistor of claim 15, wherein all of the recesses are disposed along the same cross section in the direction perpendicular to a direction of electrical conduction.

20. The shunt resistor of claim 15, wherein the surface of the of the resistive alloy plate is flush with upper surfaces of each of the pair of electrode plates, and wherein a bottom surface of the resistive alloy plate is flush with bottom surfaces of each of the pair of electrode plates.

* * * * *